US009867255B2

(12) United States Patent
Oepts et al.

(10) Patent No.: US 9,867,255 B2
(45) Date of Patent: Jan. 9, 2018

(54) LIGHT EMITTING ARRANGEMENT WITH ADJUSTABLE EMISSION SPECTRUM

(71) Applicant: PHILIPS LIGHTING HOLDING B.V., Eindhoven (NL)

(72) Inventors: Wouter Oepts, Eindhoven (NL); Lucas Josef Maria Schlangen, Eindhoven (NL); Raimond Louis Dumoulin, Eindhoven (NL); Wiebe Wagemans, Eindhoven (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 15/317,077

(22) PCT Filed: Jun. 8, 2015

(86) PCT No.: PCT/EP2015/062644
§ 371 (c)(1),
(2) Date: Dec. 7, 2016

(87) PCT Pub. No.: WO2015/189112
PCT Pub. Date: Dec. 17, 2015

(65) Prior Publication Data
US 2017/0111972 A1 Apr. 20, 2017

(30) Foreign Application Priority Data
Jun. 10, 2014 (EP) .................................... 14171701

(51) Int. Cl.
*H05B 33/00* (2006.01)
*H05B 33/08* (2006.01)
(Continued)

(52) U.S. Cl.
CPC ........... *H05B 33/0857* (2013.01); *F21V 9/16* (2013.01); *F21Y 2115/10* (2016.08)

(58) Field of Classification Search
CPC ......... H01L 2924/00; H01L 2924/0002; H01L 2224/48091; H01L 25/0753;
(Continued)

(56) References Cited

U.S. PATENT DOCUMENTS

2012/0256560 A1   10/2012   Yun
2012/0286669 A1   11/2012   Yan et al.
(Continued)

FOREIGN PATENT DOCUMENTS

WO   WO2007114614 A1   10/2007
WO   WO2009104136 A1   8/2009
(Continued)

*Primary Examiner* — Monica C King

(57) ABSTRACT

A light emitting arrangement is adapted to produce white output light of a total luminous intensity Itot and having an emission peak in the wavelength range of from 400 to 440 nm, comprising: a first light emitting element adapted to emit light of a first luminous intensity I1 and having an emission peak in a first wavelength range of from 440 to 460 nm; and a second light emitting element adapted to emit light of a second luminous intensity I2 and having an emission peak in a second wavelength range of from 380 to 440 nm, wherein the first light emitting element and the second light emitting element are independently controllable such that I2 can be adjusted independently of I1. The possibility of controlling the contribution of deep blue light allows a natural appearance of a crisp white light source at all emission intensities, and may also be used to enhance perception of contrast.

15 Claims, 5 Drawing Sheets

(51) Int. Cl.
*F21V 9/16* (2006.01)
*F21Y 115/10* (2016.01)

(58) Field of Classification Search
CPC . H01L 2924/00014; H01L 2924/12032; H01L 2924/12042; H01L 2924/15788; H01L 33/504; H01L 2251/5315; H01L 27/3269; H01L 33/507
See application file for complete search history.

(56) References Cited

U.S. PATENT DOCUMENTS

| | | |
|---|---|---|
| 2013/0075769 A1 | 3/2013 | Lee et al. |
| 2013/0114242 A1 | 5/2013 | Pickard et al. |
| 2013/0221866 A1 | 8/2013 | Kasakura et al. |
| 2013/0229114 A1 | 9/2013 | Eisele et al. |

FOREIGN PATENT DOCUMENTS

| | | |
|---|---|---|
| WO | WO2013024910 A1 | 2/2013 |
| WO | WO2013150470 A1 | 10/2013 |

LIGHT EMITTING ARRANGEMENT WITH ADJUSTABLE EMISSION SPECTRUM

CROSS-REFERENCE TO PRIOR APPLICATIONS

This application is the U.S. National Phase application under 35 U.S.C. §371 of International Application No. PCT/EP2015/062644, filed on Jun. 8, 2015, which claims the benefit of European Patent Application No. 14171701.7, filed on Jun. 10, 2014. These applications are hereby incorporated by reference herein.

FIELD OF THE INVENTION

The invention relates to a light emitting arrangement capable of providing white light emission, and to methods of using and operating such a light emitting arrangement.

BACKGROUND OF THE INVENTION

Light sources or illumination devices consisting of light emitting diodes (LEDs) are increasingly used for replacing conventional light sources such as incandescent lamps and fluorescent light sources. LEDs offer many advantages compared to conventional light sources, especially when it comes to light conversion efficiency. When LED-based light sources are used to replace traditional lighting systems, they are especially required to generate light that is perceived as white.

Color reproduction is typically measured using the color rendering index (CRI), which is calculated in Ra. The CRI is sometimes also referred to as color rendition index. The CRI is a quantitative measure of the ability of a light source to reproduce the colors of various objects faithfully in comparison with an ideal or natural light source. Natural Daylight has a high CRI, where Ra is approximately 100. Incandescent bulbs too have a Ra close to 100, while fluorescent lighting is less accurate with an Ra of typically 70-90. Consequently, in order to achieve the desired "white" light in LED-based lighting applications, light sources with a high CRI are desirable. For LED lighting systems there are warm-white or neutral-white LED modules with a color rendering of about 80-90 readily available.

Conventional white LEDs typically use a blue light emitting element and a yellow wavelength converting material to convert part of the blue light to produce a mix of light that is perceived as white. An improved LED-based solution with respect to color rendition is disclosed in WO 2013/150470, which suggests a light emitting module comprising a blue light emitting element, at least one wavelength converting material arranged to receive light emitted by the blue light emitting element, and a "deep blue" light emitting element adapted to emit light having an emission peak in a second wavelength range of from 400 to 440 nm. This module provides white light of good color rendering with a "crisp white" effect, which is desirable for many applications, for example in retail or exhibition environments.

US2013114242 describes a solid state lighting device includes a solid state light emitter combined with a lumiphor to form a solid state light emitting component, at least one lumiphor spatially segregated from the light emitting component, and another lumiphor and/or solid state light emitter. The solid state light emitting component may include a blue shifted yellow component with a higher color temperature, but in combination with the other elements the aggregated emissions from the lighting device have a lower color temperature. Multiple white or near-white components may be provided and arranged to stimulate one or more lumiphors spatially segregated therefrom.

US2013221866 describes an illuminating device comprising a plurality of semiconductor light-emitting devices differing in emission color and employing a semiconductor light-emitting element and a phosphor, wherein outputted light is stably combined, separation of light is inhibited, and color tone is variable, and which devices emit light outward on the basis of an emission from the semiconductor light-emitting element and from the phosphor which is excited by emission from the semiconductor light-emitting element to fluoresce or on the basis of emission from the phosphor which is so excited to fluoresce, the deviation duv of which from a blackbody radiation locus being within a range of $-0.02 \leq duv \leq 0.02$, in the uv chromaticity diagram according to UCS (u,v) color system (CIE 1960); and outputted lights from the light-emitting part in which the plurality of kinds of the semiconductor light-emitting devices are integrated and arranged, are mixed together and emitted outward.

WO2007114614 describes a light emitting device comprising a first light emitting portion that emits white light at a color temperature of 6000K or more and a second light emitting portion that emits white light at a color temperature of 3000K or less, which include light emitting diode chips and phosphors and are independently driven. WO2007114614 indicates that a light emitting device can be diversely applied in a desired atmosphere and use by realizing white light with different light spectrums and color temperatures. WO2007114614 indicates the effect on health by adjusting the wavelength of light or the color temperature according to the circadian rhythm of humans.

US2012256560 describes a light emitting device package includes a package body; a first light emitting device mounted on the package body and emitting light of a particular color; a second light emitting device mounted on the package body to be adjacent to the first light emitting device, adjusting an amount of light according to a current value applied thereto to thereby control a color temperature, and emitting orange light; and a resin part sealing the first and second light emitting devices and containing at least one or more types of phosphors.

SUMMARY OF THE INVENTION

However, dimming a conventional LED light source gives an unnatural appearance, compared to incandescent lamps and halogen lamps.

Hence, in spite of the LED-based systems known to date, there is still a need for improvement when it comes to the perception of light and color, especially for specialized illumination and ambience lighting.

It is an object of the present invention to overcome this problem, and to provide a light emitting arrangement which is better suited for specialized illumination and which produces light, preferably crisp white light, of a desirable, natural appearance.

According to a first aspect of the invention, this and other objects are achieved by a light emitting arrangement or light emitting module adapted to produce white output light having an emission peak in the wavelength range of from 380 to 440 nm, comprising:

at least one first light emitting element adapted to emit light of a first luminous intensity I1 and having an emission peak ("first emission peak") in a first wavelength range of from 440 to 460 nm; and at least one second light emitting element adapted to emit light of a second luminous intensity I2 and having an emission peak ("second emission peak") in a second wavelength range of from 380 to 440 nm, wherein said at least one first light emitting element and said at least one second light emitting element are independently controllable such that the second intensity of light emitted by said at least one second light emitting element can be adjusted independently of the first intensity of light emitted by the at least one first light emitting element as further especially defined in the accompanying claims.

The white output light produced by the light emitting arrangement as a whole may have a total luminous intensity $I_{tot}$.

As used herein, "deep blue" or "short wavelength blue" denotes blue light of the wavelength range of from 380 and up to 440 nm. The second light emitting element according to the invention has an emission peak wavelength in the range of from 390 to 440 nm, typically from 400 to 440 nm. Hence, light below the peak wavelength may also be within the "short wavelength blue" range.

Furthermore, as used herein, "blue", "regular blue", "normal blue" or "standard blue" generally refers to light having a peak wavelength in the range of from 440 to 460 nm.

As used herein, "light emitting element" refers to a light emitting semiconductor structure, such as a light emitting diode (LED), or an LED chip or die, or a laser diode. A light emitting diode may comprise one or more light emitting elements.

The light emitting arrangement according to the invention provides a crisp white light combined with the possibility of a natural appearance at any emission intensity, which enables a natural-looking dimming behavior. The white light may appear warm, without changing the color point. For example, upon adjusting the relative amount of deep blue light (also referred to as the deep blue contribution) the color point may differ by less than 5 SDCM (standard deviation of color matching).

In a specific embodiment, the at least one second light emitting element is adapted to emit light of a second luminous intensity I2 and has an emission peak in a second wavelength range of from 380 to 430 nm.

The possibility of adjusting the deep blue contribution in the light emitting arrangement of the invention also allows enhancing contrast perception e.g. to improve readability, and may provide a desirable perceived tone of light, especially when used for illuminating objects comprising fluorescent whitening agents.

The luminous intensity I1 is defined as the integral spectral power distribution over the blue wavelength range:

$$I1 = \int_{430}^{480} E(\lambda) d\lambda$$

The luminous intensity I2 is defined as the integral spectral power distribution over the deep blue wavelength range:

$$I2 = \int_{x}^{430} E(\lambda)(430-\lambda) d\lambda, \text{ where } x=380 \text{ nm or preferably } x=400 \text{ nm.}$$

The total luminous intensity $I_{tot}$ is defined as the integral spectral power distribution over the deep blue wavelength range:

$$I_{tot} = \int_{380}^{780} E(\lambda) d\lambda.$$

Hence, a ratio A' may be defined $$A' = \frac{\int_{380}^{430} E(\lambda)(430-\lambda) d\lambda}{\int_{380}^{780} E(\lambda) d\lambda},$$

In embodiments of the invention, A' may be at least 0.6. A maximum value of A' may be at least 1.5 times the minimum value of A'. In embodiments of the invention, A' may be up to 5.0.

When the intensity $I_{tot}$ is decreased, the correlated color temperature (CCT) of the emission is decreased. Simultaneously, A' is decreased by reducing the contribution of the deep blue light. As a result, the perception of warm colors when dimming is enhanced, especially when used for illuminating an object, such as a paper, comprising a fluorescent whitening agent.

The operation of the second light emitting element may be dependent on the total luminous intensity $I_{tot}$.

In order to produce white light the light emitting arrangement typically further comprises at least one third emitter, adapted to produce light having an emission peak in the green to red wavelength range. This additional emitted may be one or more further light emitting elements, e.g. a green light emitting element, a yellow light emitting element, an amber light emitting element, a red light emitting element, or any combination thereof. In some embodiments, the third emitted may be a wavelength converting member which receives and converts light e.g. from the first light emitting element into light of longer wavelengths, typically green to red.

In embodiments of the invention, the light emitting arrangement further comprises at least one wavelength converting member arranged to receive light emitted by said first light emitting element, and being capable of emitting light having an emission peak in the green to red wavelength range.

Typically, the light emitting arrangement may be dimmable.

The light emitting arrangement may comprise a controller operatively connected to the at least one first light emitting element and the at least one second light emitting element. The controller is typically capable of generating a first control signal to increase or decrease the first intensity I1 of the light emitted by the first light emitting element, and a second control signal to increase or decrease, independently of the first control signal, the second intensity I2 of the light emitted by the second light emitting element, such that the intensity ratio A' is variable by means of the controller. The first light emitting element and the second light emitting element may be independently electrically connected to the controller.

Hence, the controller is especially configured to control the white output light of the lighting arrangement. The controller may in an embodiment be configured to control the white output light by controlling the luminous intensities of the first light emitting element and the second light emitting element (and optionally further light emitting elements). By varying the intensities, the white light can be controlled in intensity, color point, and relative intensity in the wavelength range of 380-440 nm, especially in the wavelength range of 380-430 nm. In this way, not only the correlated color temperature may be varied, but also the contrast perception and crispness of the white light.

Controlling of light emitting elements per se, especially semiconductor based light emitting elements, such as indicated above, is known in the art.

In embodiments of the invention, the light emitting arrangement, in particular the controller, may be adapted to decrease the second intensity I2 relative to the first intensity I1 while the light emitting module is dimmed.

In embodiments of the invention, the light emitting arrangement, in particular the controller, may be adapted to adjust A' over time. For example, A' may thus be varied automatically depending on the time of day.

In embodiments of the invention, the operation of the first and/or second light emitting elements, and hence the intensity ratio A', can be controlled by a user.

In embodiments using at least one wavelength converting member as described above, the wavelength converting member may be arranged to receive light emitted by the first light emitting element and may comprise a yellow-green wavelength converting material and a red wavelength converting material. Hence, the wavelength converting member may comprise a mixture of two or more wavelength converting materials, in particular a mix of green-yellow and red wavelength converting materials. Such a combination provides a desirable contribution for a white light output spectrum.

In some embodiments, the light emitting arrangement may comprise a further wavelength converting member arranged to receive light emitted by said second light emitting element, wherein the further wavelength converting member comprises a yellow-green wavelength converting material and lacks a red wavelength converting material. Many yellow-green wavelength converting materials converts regular blue light (e.g. at 450 nm), but have limited absorption/conversion of deep blue light (e.g. at 410 nm). However, a red wavelength converting material may be excited by and convert deep blue light as well as regular blue light. Since deep blue light emitting elements typically are less efficient than regular blue light emitting elements, undesired absorption/conversion of deep blue light requires more deep blue light emitting elements to be used in order to provide the desired total emission spectrum having a deep blue peak, which reduces the overall efficiency and increases cost. Hence, the omission of a red wavelength converting material in the wavelength converting member receiving deep blue light is advantageous because it avoids loss of deep blue light by absorption of the red wavelength converting material.

In embodiments of the invention the light emitting arrangement further comprises at least one third light emitting element adapted to emit light having an emission peak in a third wavelength range. For example, the third light emitting element may be an amber light emitting element, emitting light e.g. in the range of from 590 to 620 nm, such as about 600-610 nm. The use of a third light emitting element may improve color point stability especially when the ratio A' is changes.

In a second aspect, the invention provides a luminaire comprising a light emitting arrangement according to the first aspect described above.

In a further aspect, the invention provides a spotlight comprising a light emitting arrangement according to the first aspect described above.

In another aspect, the invention relates to the use of a light emitting arrangement according the first aspect described above for illuminating a fluorescent whitening agent (FWA), such as for illuminating a fluorescent whitening agent (FWA) comprised by an object. The possibility of adjusting the deep blue contribution to the total light emission is especially advantageous when used for illuminating surfaces comprising FWA, since it ensures a natural white appearance at all emission intensities, and also allows adjustment of black-white contrast according to user needs, which may improve readability.

In a further aspect, the invention provides a method of operating a light emitting arrangement according to the first aspect, comprising the step of increasing or decreasing the intensity I2 relative to the intensity I1 and/or the total intensity $I_{tot}$. In particular the method comprises the step of increasing or decreasing the intensity ratio A'.

For example, the method may comprise increasing the intensity ratio A' by increasing the first intensity relative to the second intensity. This represents an increase of the deep blue contribution to the total emission spectrum and is advantageous for example for increasing contrast perception when reading on white paper, which may be especially useful for elderly persons or persons with visual impairment, but also useful for improving readability at relatively low lighting conditions.

Finally, the method may comprise decreasing the total light intensity $I_{tot}$ emitted by the light emitting arrangement, and decreasing the intensity I2 relative to the intensity I1 and/or the total intensity $I_{tot}$, in particular decreasing the intensity ratio A'. Alternatively (or as an additional step, performed before or after the step just described) the method may comprise increasing the total light intensity $I_{tot}$, and increasing the intensity I2 relative to the intensity I1 and/or the total intensity $I_{tot}$, in particular increasing the intensity ratio A'.

Especially, the peak wavelengths of the first emission peak and the second emission peak differ with at least 10 nm, such as at least 15 nm, like at least 20 nm, especially at least 30 nm, such as for instance a peak at about 425 nm (first emission peak) and about 465 nm (second emission peak) (similar as in FIG. 6). Hence, the at least one first light emitting element and at least one second light emitting element are especially configured to provide light having different spectral distribution.

The term "first light emitting element" may also refer to a plurality of substantially identical first light emitting elements. Likewise, the term second light emitting element" may also refer to a plurality of substantially identical second light emitting elements.

The term white light herein is known to the person skilled in the art. It especially relates to light having a correlated color temperature (CCT) between about 2000 K and 8000 K, especially in the range of about 2700 K and 6500 K, such as in the range of 2000-5700 K, and especially within about 15 SDCM (standard deviation of color matching) from the BBL (black body locus), especially within about 10 SDCM from the BBL, even more especially within about 5 SDCM from the BBL. Herein, as indicated above, the lighting apparatus may especially have a variable correlated color temperature over at least about 2000 K such as e.g. between at least about 2000-4000 K, even more especially at least over a range of at least about 3000 K, such as e.g. between at least about 2000-5000 K, or even variable over a correlated color temperature range of at least about 2000-5700 K.

Especially, the controller is configured to control the first light emitting element, the second light emitting element and optionally further light emitting elements (such as a third, a fourth . . . , light emitting element). Especially, the controller is thus configured to control the intensity of the first light emitting element light, the second light emitting element light and optionally further light emitting element light. The controller can especially control the light emitting elements independently.

Further, especially the controller is configured to control the first light emitting element, the second light emitting element, etc. as function of one or more of a time signal and an ambient light sensor. In this way, the lighting apparatus may e.g. automatically adjust the correlated color temperature (CCT). However, in yet a further embodiment the controller may also be configured to control the light emitting elements as function of a user input value. For instance, one may desire to adjust the correlated color temperature or correlated color temperature scheme, for example to prepare for a jetlag or to recover from a jetlag (smoothly). Hence, in an embodiment the light emitting arrangement is configured to provide white light with a variable color temperature and/or a variable relative intensity (relative to the total intensity of the white output light) in the 380-460 nm wavelength region.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

When dimmed, the light emitted by conventional LEDs (as well as the light source proposed in WO2013/150470), may be perceived as unnatural or unaesthetic. This is regarded as a drawback since many lighting applications demand a natural-looking light at various emission intensities. The present inventors have realized that the unnatural-looking light emission of LEDs when dimmed is due to the fact that unlike incandescent and halogen lamps, the emission spectrum of LEDs does not change when the intensity changes. When dimming incandescent lamps, lowering the driving current alters the emission spectrum, and the color point of the emitted light moves over the black body line to a lower color temperature (the filament is less warm).

Now the present inventors have found that by adjusting the relative amount of deep blue light emitted from a "crisp white" light source, the white light may appear warmer, and this is possible without substantially changing the color point. Especially, it has been found that by decreasing the relative amount of deep blue light in relation to the "regular" blue light and/or the total light emission, a warmer light can be obtained. This is particularly useful in combination with dimming, i.e. decreasing the overall luminous intensity of the light source, because the dimmed light is then perceived as more natural. Meanwhile, advantageously, color distortions and CRI changes may be kept minimal, so that the output light may still be of high quality with respect to color rendering. It has also been realized that by adjusting the deep blue contribution to the total light emission, the perception of contrast can be influenced, especially when the light emitting arrangement is used to illuminate a surface comprising a fluorescent whitening agent. For example, by increasing the contribution of deep blue light, the perception of contrast of printed material may be enhanced, thus improving or supporting readability.

Figure 1:
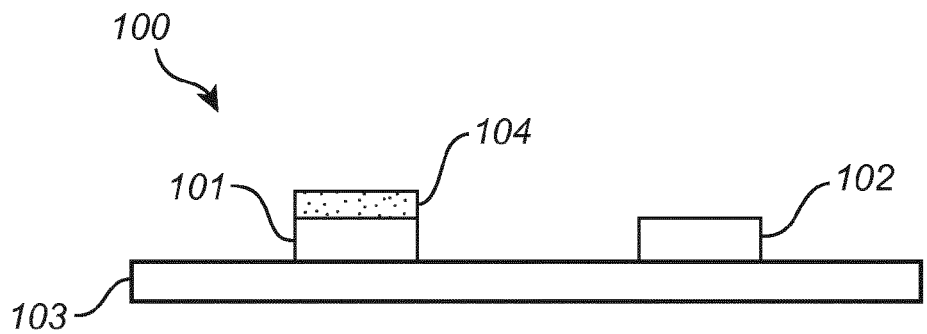
FIG. 1 is a schematic side view of a light emitting arrangement according to embodiments of the invention.

FIG. 1 illustrates an embodiment of the present invention in the form of a light emitting arrangement 100 which may form part of a light emitting module equipped with driving electronics etc., as appreciated by a skilled person. The light emitting arrangement 100 comprises a first light emitting element 101 and a second light emitting element 102 arranged on a support 103. The first light emitting element 101, here a first light emitting diode (LED) chip, is adapted to emit light in the "regular" blue wavelength range, in particular light having an emission peak in the range from 440 to 460 nm, having a luminous intensity I1. A wavelength converting member 104, comprising a wavelength converting material (sometimes also referred to as a phosphor), is arranged on the first LED chip 101, e.g. as a layer. The wavelength converting member 104 is adapted to convert part of the blue light emitted by the first LED 101 into light of longer wavelengths, typically of the green to red spectral range, so that the resulting combination of blue light (440-460 nm) and green to red light is perceived as white. The LED chip 101 in combination with the wavelength converting member 104 may be referred to as a phosphor-converted white LED chip.

Further, the second light emitting element 102, here a second LED chip, is adapted to emit deep blue light of a luminous intensity I2, typically light having an emission peak in the wavelength range of from 380 nm to 430 nm. In this embodiment, the second LED chip 102 lacks a wavelength converting material, and may be referred to as a direct emitting LED chip.

During operation, light emitted from the first LED chip will be partially converted by the wavelength converting material 104 to yield white light having a conventional spectral distribution. However, the light emitted by the second LED chip will not be converted by any wavelength converting member, and thus will provide a spectral contribution to the total light output from the light emitting arrangement in the form of an emission peak in the wavelength range of from 400 to 440 nm. Hence, the light emitting arrangement 100 yields white output light having an additional emission peak in the wavelength range of from 380 to 430 nm, which results from the second LED chip 102.

In some embodiments, the second LED chip 102 may be adapted to emit light of the wavelength range of from 400 nm to 430 nm, or from 400 to 420 nm.

The support 103 may be or form part of any suitable physical and/or functional support structure, including a printed circuit board (PCB). The support 103 may carry means for electrical connection required for the light emitting elements 101, 102. Optionally, parts of the support 103 may be reflective. It is also contemplated the light emitting arrangement 100 may be surrounded by at least one reflective wall, optionally forming a light mixing chamber.

The first light emitting element 101 and the second light emitting element 102 are independently controllable, such that the luminous intensity I1 of light emitted by the first light emitting element 101 and the luminous intensity I2 of light emitted by the second light emitting element 102 are independently controllable, and be varied relative to each other. This independent control can for example be exerted by controlling the electrical currents driving the respective light emitting elements 101,102. In such embodiments, the first light emitting element 101 and the second light emitting element have independent electrical connections to the control circuitry, such that different currents can be delivered to the first light emitting element 101 and the second light emitting element 102, respectively. Due to the independent control that can be exerted over the respective light emitting elements 101 and 102, the intensity I2 of light emitted by the second light emitting element 102 may be decreased or increased relative to the intensity I1 of light emitted by the first light emitting elements 101, and/or relative to the total luminous intensity ($I_{tot}$) of light emitted by the light emitting arrangement as a whole, optionally when also decreasing or increasing $I_{tot}$.

The ratio of the intensity I1, calculated as the integral spectral power distribution E(λ) over the "deep blue" wavelength range, to the total intensity $I_{tot}$, calculated as the integral spectral power distribution of the total spectrum emitted by the light emitting arrangement as a whole over the wavelength range 380-780 nm, is expressed as:

$$\frac{\int_{380}^{430} E(\lambda)(430-\lambda)d\lambda}{\int_{380}^{780} E(\lambda)d\lambda} = A'$$

Typically, A' may be at least 0.6. In embodiments of the invention A may be up to 5, thus typically 0.6≥A'≥5. However in embodiments of the invention A' may also be higher than 5.

It has previously been found that at deep blue peak wavelengths in the lower part of the deep blue wavelength range (e.g., around 405 nm), the intensity required for achieving a "crisp white" effect was lower than for deep blue emission peak wavelengths in the upper part of the deep blue wavelength range (e.g. about 420 nm). The ratio A' defined above takes account of this wavelength dependency.

Furthermore, to achieve a desired change on the perceived "crispness" of the light when dimming, the deep blue contribution should be changed as a function of the correlated color temperature.

An advantage of using the ratio A' defined above which uses the integral spectral power distribution rather than, for example, a ratio R defined as the ratio of the directly measured intensity of deep blue light to the directly measured intensity of blue light, is that A' is independent of color temperature and color point. In contrast, the ratio R would be dependent on color temperature.

Figure 2:
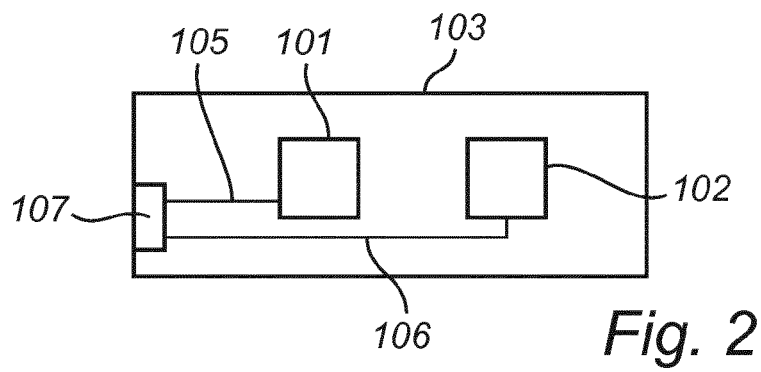
FIG. 2 is a top view of a light emitting arrangement similar to that of FIG. 1.

FIG. 2 schematically illustrates a top view of a light emitting arrangement similar to the embodiment shown in FIG. 1, with the addition of electrical leads 105, 106 and a controller 107. The electrical leads 105 connect the controller 107 to the first light emitting element 101 to and the electrical leads 106 connect the controller 107 to the second light emitting element 102. The controller may be connected to conventional drive electronics and is adapted to control the current supplied via the electrical leads 105, 106 to each of the light emitting elements 101, 102 independently. The controller may hence be capable of increasing or decreasing the light emission intensity of either, or both, of the first or the second light emitting elements, as well as increasing or decreasing the total light emission by the light emitting arrangement 100. In embodiments of the invention, the controller 107 may comprise, or form part of, or be connected to, a dimmer. The controller may be operated by a user or may be programmed to exert a predetermined control of the light emission.

The controller 107 may be adapted, e.g. programmed, to decrease the intensity I2 of light emitted by the second light emitting element 102 relative to the intensity I1 of light emitted by the first light emitting elements 101, and/or relative to the total luminous intensity ($I_{tot}$) of light emitted by the light emitting arrangement as a whole, in particular when also decreasing $I_{tot}$. That is, the relative contribution of deep blue light may be decreased, in particular when also decreasing the total luminous intensity $I_{tot}$.

Correspondingly, the controller may be adapted increase A', that is the contribution of deep blue light relative to $I_{tot}$, for example when the total luminous intensity $I_{tot}$ is increased. However, it may also be useful to decrease or increase the ratio A' independently of any change in the total light emission intensity, and hence the controller may be adapted to decrease or increase A' without substantially affecting the total intensity $I_{tot}$. In embodiments of the invention the controller 107 may be adapted, e.g. programmed, to increase the intensity of light emitted by the second light emitting element 102 relative to the intensity of light emitted by the first light emitting element 101, for example based on input from a user or in response to a signal representing an external condition.

In any embodiment of the invention described herein, the light emitting arrangement may comprise a plurality of said first light emitting elements and optionally also of said second light emitting elements. Typically all or some of the first light emitting elements form a first group of light emitting elements which is independently controllable relative to a second group of light emitting elements formed of all or some of said second light emitting elements.

The light emitting module according to embodiments of the invention may be adapted to produce white output light having an emission peak in the wavelength range of from 380 to 430 nm, e.g. from 400 to 430 nm, such as from 400 to 420 nm or from 410 to 420 nm. The second wavelength range, produced by the second light emitting element, may thus be from 380 to 430 nm, e.g. from 400 to 430 nm, such as from 400 to 420 nm or from 410 to 420 nm.

In embodiments of the invention, the light emitting module comprises at least two different wavelength converting materials. For example, one wavelength converting material may be capable of emitting light having an emission peak wavelength in the range of from 500 to 600 nm (representing green-yellow) and one wavelength converting material may be capable of emitting light having an emission peak wavelength in the range of from 600-780 nm (representing orange or red). Hence, as an example, the wavelength converting member 104 may comprise a combination of phosphor materials, for example a yellow-green phosphor and a red phosphor. In other embodiments of the invention, the second light emitting element may completely lack a wavelength converting material.

Examples of suitable wavelength converting materials include, but are not limited to, cerium (Ce) doped garnets, such as Ce doped YAG ($Y_3Al_5O_{12}$), also denoted YAG:Ce or Ce doped LuAG ($Lu_3Al_5O_{12}$), also denoted LuAG:Ce. YAG:Ce emits yellowish light, whereas LuAG:Ce emits yellow-greenish light. Alternatively, a YAG:Ce material in which some of the yttrium is replaced with gallium (Ga) (thus emitting yellow-greenish light) may be used.

The absorption maximum of YAG:Ce is typically at around 455 nm. The absorption maximum of LuAG:Ce is typically at around 445 nm. Using YAG:Ce, a CRI of 80 may be achieved. Using LuAG:Ce, a higher CRI, up to 90, may be achieved.

Examples of inorganic phosphor materials which emit red light may include, but are not limited to ECAS (ECAS, which is $Ca_{1-x}AlSiN_3:Eu_x$ wherein $0<x\leq1$; preferably $0<x\leq0.2$) and BSSN (BSSNE, which is $Ba_{2-x-z}M_xSi_{5-y}Al_yN_{8-y}O_y:Eu_z$ wherein M represents Sr or Ca, $0\leq x\leq1$ and preferably $0\leq x\leq0.2$, $0\leq y\leq4$, and $0.0005\leq z\leq0.05$).

Figure 3:
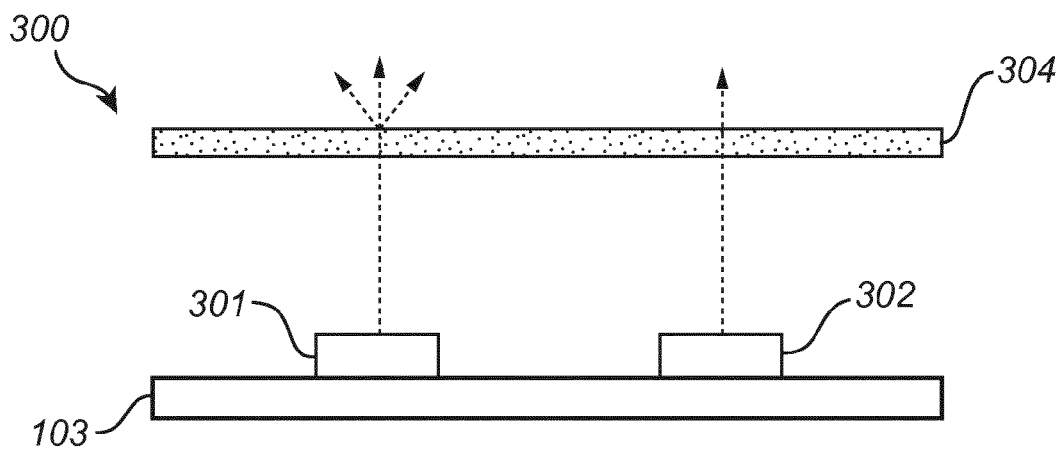
FIG. 3 is a schematic side view of a light emitting arrangement according to embodiments of the invention.
Figure 4:
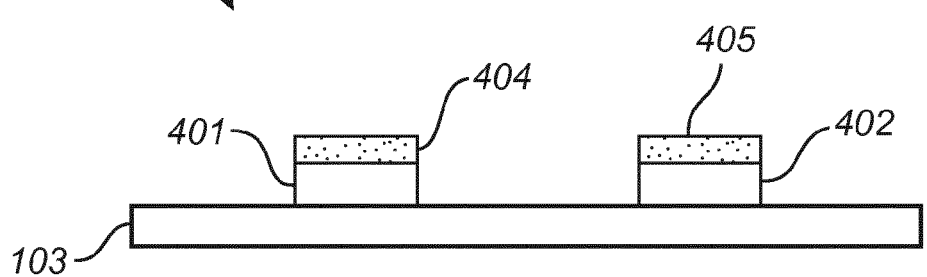
FIG. 4 is a schematic side view of a light emitting arrangement according to embodiments of the invention.
Figure 5:
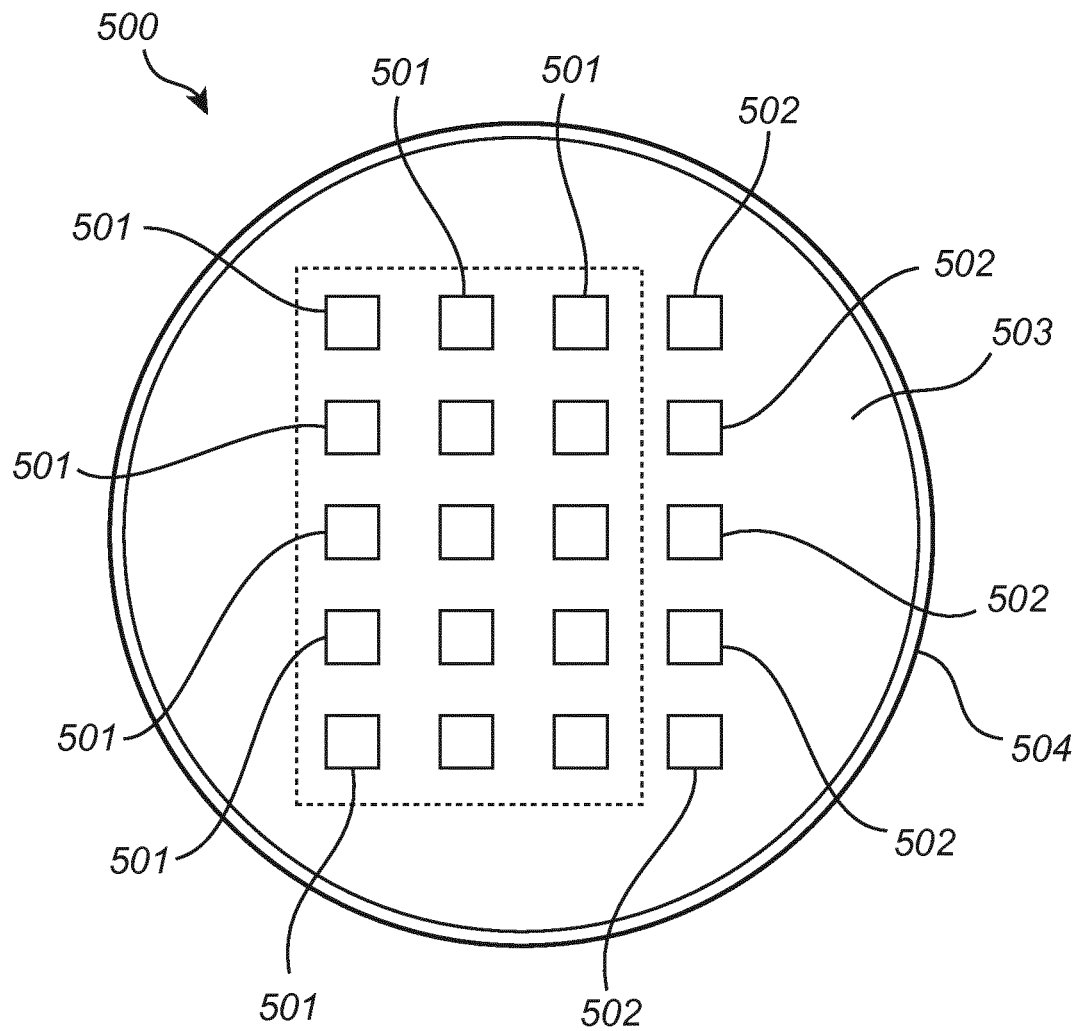
FIG. 5 is a top view of a light emitting module according to embodiments of the invention.

FIGS. 3 to 5 illustrate various embodiments of a light emitting arrangement according to the invention.

FIG. 3 shows a light emitting arrangement 300 comprises a first light emitting element, here a first LED chip 301, and a second light emitting element, here a second LED chip 302 arranged on a support 103. The first LED chip 301 is adapted to emit blue light of the wavelength range of from 440 to 460 nm. The second LED chip 302 is adapted to emit light of the wavelength range of from 380 to 430 nm. The first and second LED chips 301, 302 are independently controllable as described above, typically by means of a controller (not shown).

In contrast to the embodiment described above with reference to FIGS. 1 and 2, the first LED chip 301 is not a phosphor-converted LED chip, i.e. does not have a wavelength converting material arranged directly on top of the chip. Instead, in the embodiment shown in FIG. 3, a wavelength converting member 304 comprising wavelength converting material is arranged remotely from both the first LED chip 301 and the second LED chip 302, to receive light emitted by both LED chips 301, 302. The wavelength converting member 304 may be referred to as a "remote phosphor" or as being in "remote configuration". The wavelength converting member 304 may also be referred to as a remote phosphor layer. The wavelength converting member may be self-supporting and may be provided in the form of a film, a sheet, a plate, a disc, or the like. Although not shown in FIG. 3, the wavelength converting member may be supported by one or more side walls surrounding the light sources 301, 302, such that the wavelength converting member forms a lid or a window.

The wavelength converting material contained in the wavelength converting member 304 is typically adapted to convert blue light into light of longer wavelengths, typically of the green to red spectral range, so that the resulting combination of blue light (440-460 nm) and green to red light is perceived as white. Thus, light emitted by the first LED 301 is received by the wavelength converting member 304 and is partially converted, whereas light emitted by the second LED 302 which is received by the wavelength converting member 304 is not substantially converted, but rather transmitted. The light emitting arrangement 300 hence yields white output light having an additional emission peak in the wavelength range of from 380 to 430 nm, which results from the second LED chip 302.

In some embodiments, the wavelength converting member 304 may comprise a wavelength converting material having an absorption maximum above 450 nm, for example at about 455 nm. One example of such a material is YAG:Ce. In such embodiments, the second LED chip 302 may have an emission peak at or near 440 nm, which due to the higher absorption wavelength of the wavelength converting material may still avoid too much conversion of light emitted by the second LED chip 302, in particular light having wavelengths below 435 nm.

In some embodiments, the wavelength converting member 304 may comprise a wavelength converting material having an absorption maximum below 450 nm, e.g. at or around 445 nm. One example of such a material is LuAG:Ce.

The wavelength converting member 304 may comprise a combination of wavelength converting materials as described above, including patterned arrangements, e.g. where a first zone of the wavelength converting member comprises a first wavelength converting material and a second zone of the wavelength converting member comprises a second wavelength converting materials, and the first and second zones are spatially arranged to receive light from different light emitting elements.

As an alternative to the remote phosphor arrangement illustrated in FIG. 3, it is contemplated that the LED chips 301, 302 may instead be covered by a continuous phosphor layer applied directly over both LED chips as well as the support 103. Such a phosphor layer may comprise a single wavelength converting material or a combination of wavelength converting materials, and may be produced by providing the wavelength converting material(s) in fluid form, e.g. dispersed in a carrier liquid, and dispensing the fluid to cover the light emitting elements 301, 302. Optionally the layer may be cured.

Another embodiment is illustrated in FIG. 4. This figure shows a light emitting arrangement 400 which may form part of a light emitting module, comprising a first light emitting element 401 in the form of a first LED chip, and a second light emitting element 402 in the form of a second LED chip, arranged on a support 103. The first and second LED chips 401, 402 are independently controllable as described above, typically by means of a controller (not shown). In this embodiment, the first LED chip 401 and the second LED chip 402 correspond to the first and second LED chips 101, 102 described above with reference to FIG. 1, except that in the present embodiment, also the second LED chip 402 is a so-called phosphor-converted LED chip. Here, the first LED chip 401 is provided with a first wavelength converting member 404, and the second LED chip 402 is provided with a second wavelength converting member 405. The first and second wavelength converting members 404, 405 may comprise the same or different wavelength converting materials.

Typically, the first LED chip 401 is adapted to emit light in the wavelength range of from 440 to 460 nm. The first wavelength converting member 404 converts part of this light into light of longer wavelengths, so that the total emission from the phosphor-converted first light emitting element 401 including the wavelength converting member 404 is perceived as white. Furthermore, the second LED chip 402 typically emits light in the wavelength range of from 380 to 430 nm and the wavelength converting material 405 receives and converts part of this light into light of longer wavelengths, so that also the total emission from the light emitting element 302 including the wavelength converting material 405 is perceived as white. However, a sufficient amount of the light emitted by the second LED chip 302 is not absorbed and converted by the wavelength converting material 405, thus providing an emission peak in the wavelength range of from 380 to 430 nm to the total output spectrum of the light emitting arrangement 400.

In some variants of this embodiment, the first wavelength converting member 404 may comprise a combination of wavelength converting materials, for example a combination of a yellow or green-yellow phosphor, and a red phosphor. The second wavelength converting member 405 may comprise either a combination of wavelength converting materials, or a single wavelength converting material, especially a yellow or green-yellow phosphor. In particular, the wavelength converting member 405 may lack a red wavelength converting material.

FIG. 5 shows a top view of a light emitting module 500 comprising a plurality of light emitting diodes, here 20 individual LED chips, arranged on a board or support 503. The module comprises a plurality of first LED chips 501 adapted to emit light of the first wavelength range as defined herein, and at least one second LED chip 502 adapted to emit light of a second wavelength range as defined herein. Typically the module 400 comprises a plurality of said second LED chips 502. The LED chips 501 form a first group, as indicated by the dashed line, of light emitting elements providing light emission of a luminous intensity I1, and the LED chips 502 form a second group of light emitting elements providing light emission of a second luminous intensity I2. The first group of light emitting elements is controllable independently of the second group of light emitting elements, such that the light emission intensity I1 and I2 are independently controllable as described above. The LED chips 501 of the first group of light emitting elements may be connected to each other and to a controller as described above. Similarly, the LED chips 502 of the second group of light emitting element may be connected to each other and to the controller.

For example, the first group of light emitting elements may be arranged as one or more rows or strings of interconnected (wire bonded) light emitting elements. In the embodiment illustrated in FIG. 5, the first light emitting elements 501 could be arranged in three rows, each row comprising five interconnected LED chips. Alternatively, the first light emitting elements 501 in the embodiment of FIG. 5 may be arranged as five rows, each row comprising three interconnected LED chips. Optionally, the different rows or strings of light emitting elements 501 may be independently controllable. Turning to the second light emitting elements, in FIG. 5 represented by LED chips 502, these may constitute a single group, arranged as a row or string of e.g. five interconnected LED chips 502. It is contemplated that a light emitting module according to embodiments of the invention may comprise any number of first light emitting elements 501 and second light emitting elements 501, and that these may be arranged in any number of groups in any suitable manner, e.g. as rows, two-dimensional arrays, or any other pattern.

Furthermore, FIG. 5 shows a circular side wall 504 of a height exceeding the height of the LED chips 501, 502 is provided at the periphery of the board 503, enclosing the LED chips 501, 502, and may act as a support for an wavelength converting member which may be arranged as a lid or window, remotely from the LED chips 501, 502. The side wall 504 may have a reflective inner surface facing the LED chips 501, 502, thus forming a reflective light mixing chamber.

Optionally, rather than having a remote wavelength converting member covering the module 500, a wavelength converting material may be provided directly on or in the vicinity of the individual LED chips 501, and optionally also the individual LED chip(s) 502. For example, the LED chips 501, and optionally also LED chips 502, may be phosphor-converted, similar to FIG. 1 or FIG. 4, respectively. Alternatively, a continuous layer of wavelength converting material may be applied over the LED chips 501 as well as the LED chips 502.

Figure 6:
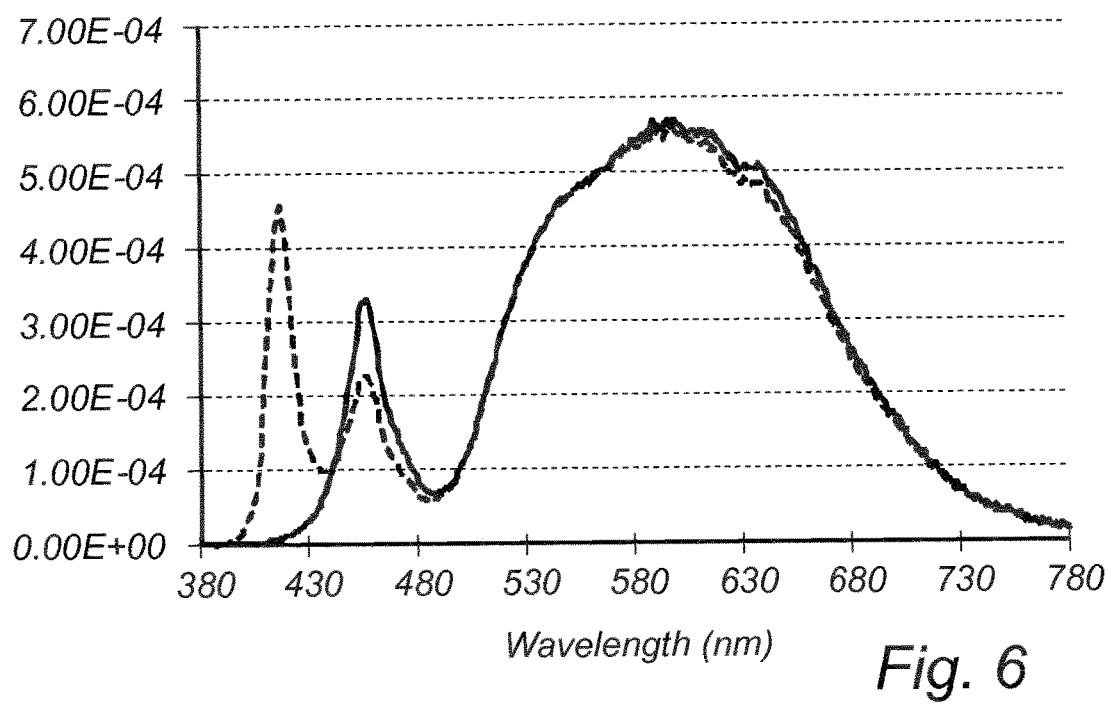
FIG. 6 is a graph showing an exemplary light emission spectrum of a light emitting arrangement according to embodiments of the invention (dashed line) and an exemplary light emission spectrum of a conventional white light emitting arrangement (solid line). As can be seen from this graph, white light with a variable color temperature and/or a variable relative intensity in the 380-460 nm wavelength region (relative to the total intensity of the white output light in the 380-780 nm wavelength region).

A light emitting arrangement or module according to the present invention provides a highly desirable white light that is perceived as "crisp" and cool but still with warm and natural rendition of color. FIG. 6 shows an exemplary emission spectrum, represented by a dashed line, of a light emitting module according to embodiments of the present invention. A conventional white light spectrum, without the addition of a deep blue component, is represented by a solid line. Advantageously, the color temperature of the output spectrum of a light emitting module according to embodiments of the invention may be tuned e.g. to a warmer white tone by decreasing R, without substantially affecting the color rendition (CRI).

The term chromaticity is used to identify the color of a light source regardless of its brightness or luminance. In particular, the chromaticity of a light source can be represented by chromaticity coordinates, or color points in the 1931 CIE Chromaticity Diagram or the 1976 CIE Chromaticity Diagram (Commission International de l'Eclairage). The color temperature of a light source is defined in terms of an ideal, purely thermal light source also known as a blackbody radiator, whose light spectrum has the same chromaticity as that of the light source. The color temperature is measured in Kelvin (K). The so called black body locus (or line) is the path or line that the color of an incandescent black body would take in a particular chromaticity space as the blackbody temperature changes.

To further improve the white appearance the color point of the light emitting arrangement or module according to embodiments of the invention may be tuned to lie below the black body line (BBL), in particular for low correlated color temperatures, CCTs (typically 4000 K or less).

It has been established an object appears whiter either if it appears brighter, or if it appears achromatic or slightly chromatic with a blue tint. Hence, a bluish color point is perceived as whiter than a color point that lies on the black body line (BBL). However, the addition of "normal" blue light to the output spectrum of conventional LED light sources will also result in a color point outside the ANSI (American National Standards Institute) color space, which defines acceptable variations for an LED light source of a determined color temperature (e.g. 3000 K), also referred to as "ANSI bins". However, by adding deep blue light rather than normal blue, the final color point may again be located within the ANSI space, and still give excellent white rendering, including "crisp white".

Figure 7:
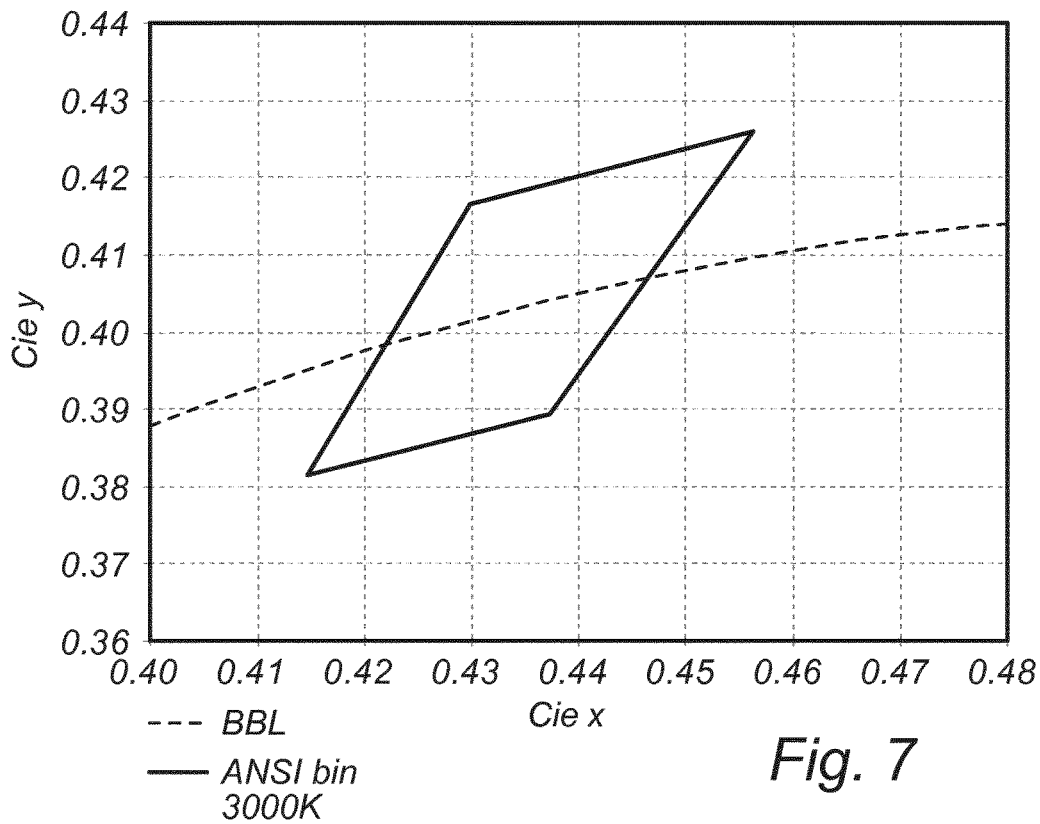
FIG. 7 shows a portion of the 1931 CIE chromaticity diagram including the black body line around a color temperature of 3000 K.

FIG. 7 is a schematic illustration of a part of the CIE 1931 chromaticity diagram indicating the black body line around 3000 K and the ANSI color space for a color temperature of 3000 K.

Figure 8:
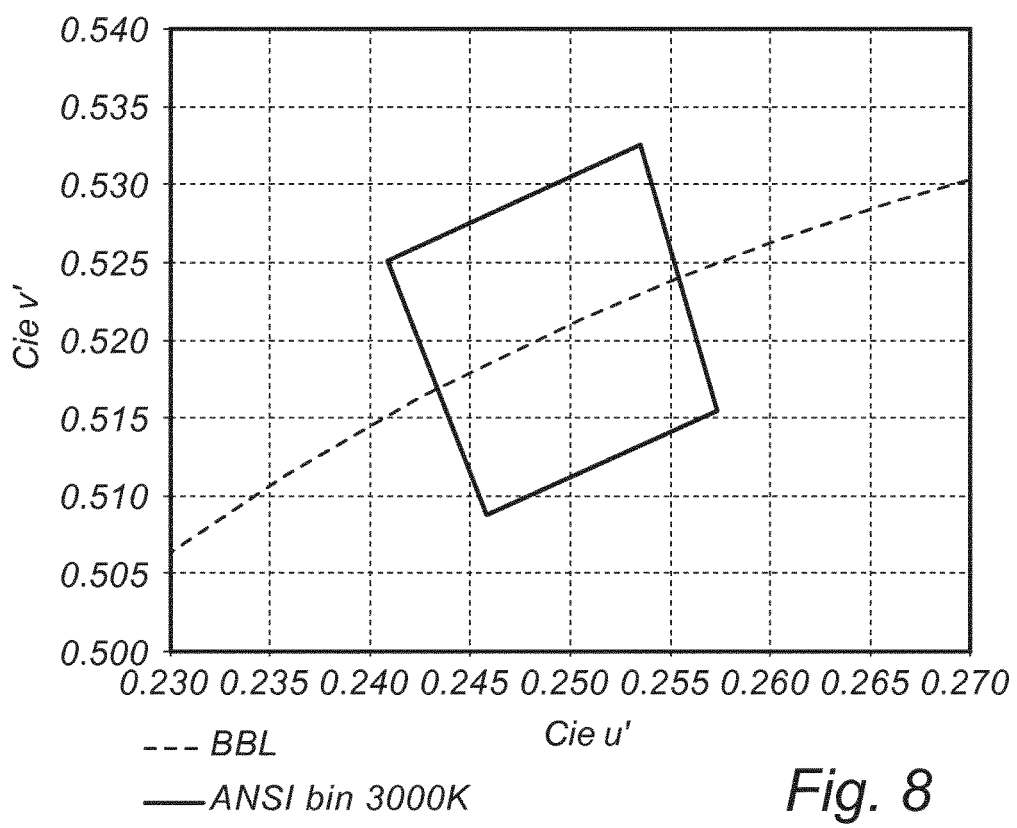
FIG. 8 shows a portion of the 1976 CIE chromaticity diagram including the black body line around a color temperature of 3000 K.

The color point may also be represented in the 1976 CIE chromaticity diagram. FIG. 8 shows the black body line at around 3000 K in the 1976 CIE chromaticity diagram, including the ANSI color space in this diagram for a color temperature of 3000 K. The 1976 CIE diagram is sometimes considered more suitable for representing shifts in color points perceived by the human eye.

The light generated by a light emitting arrangement or module described herein may have a color point in the CIE 1931 chromaticity diagram or the 1976 CIE chromaticity diagram which lies on the black body line.

In embodiments of the invention, the light generated by the light emitting module may have a color point in the CIE 1931 chromaticity diagram or the 1976 CIE chromaticity diagram which lies below or slightly below the black body line. When the color point of the light generated by the light emitting module is tuned at little bit below the black body line this further improves the white appearance of an illuminated white object.

In some embodiments, the light generated by the light emitting module may have a color point in the CIE 1931 chromaticity diagram or the 1976 CIE chromaticity diagram which lies within the ANSI color space for the respective color temperature of the light emitting module.

A light emitting module according to embodiments of the invention may advantageously be used for illuminating objects and articles comprising a fluorescent whitening agent (FWA).

The name "fluorescent whitening agents" generally denotes chemical substances that upon excitation by UV light produce blue fluorescence usually with a peak at 445 nm. Fluorescent whitening agents are added to many products, for example paper, fabrics and plastics, in order to improve the white appearance. However, fluorescent whitening agents are also susceptible of excitation by deep blue light, which leads to emission of regular blue light, thus contributing to improving the white impression of the illuminated material. In particular, light having a wavelength of 440 nm or lower, especially 420 nm or lower, can excite fluorescent whitening agents. In embodiments of the invention, a second light emitting diode having an emission peak wavelength in the range of from 380 to 430 nm may produce a sufficient intensity of light of ≤420 nm to effectively excite a fluorescent whitening agent.

Figure 9:
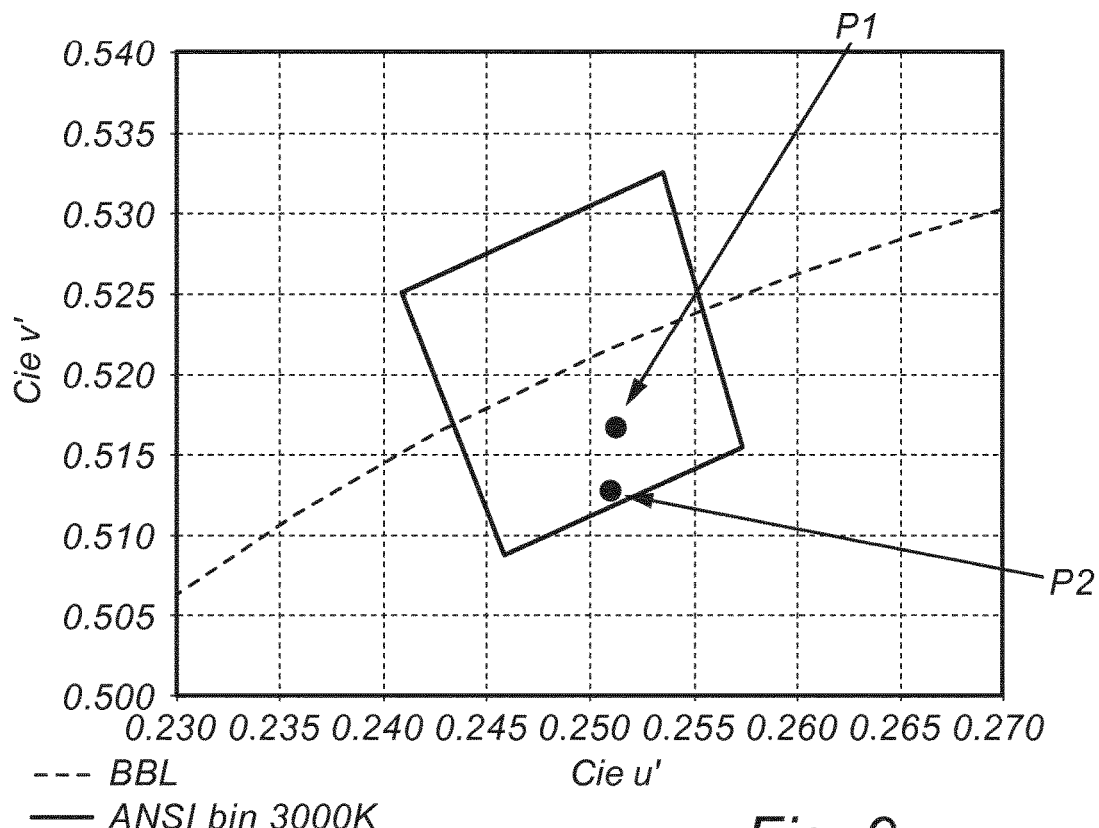
FIG. 9 is a graph illustrating the difference in color point between the light emitted by a light emitting arrangement according to embodiments of the invention and the reflected/emitted spectrum of an illuminated object comprising a fluorescent whitening agent.

A desirable "crisp white" effect may be represented by the difference (v' shift, Δv' as seen in the 1976 CIE diagram) in color point of the light emitted/reflected by an object containing FWA compared to the light emitted by the light source used for illuminating said object. This effect is illustrated in FIG. 9. P1 represents the color point of the light emitted by the light source as such, whereas P2 represents the color point of the light reflected by the illuminated object. When the color point of the emitted/reflected light P2 is shifted further below the black body line compared to the color point of the emitted light P1, this may represent a crisp white effect. In order to provide a desired improvement in white rendition and a "crisp white" effect, a Δv' of at least −0.002 (|−Δv'|≥0.002) may be sufficient, in particular where the color point of the light source is already below the black body line. However, depending on the color point of the light source, a larger v' shift, e.g. a Δv' of at least −0.005, may be desirable.

It has previously been found that the "crisp white" effect (e.g., a Δv' of −0.005) obtained when illuminating an object containing a fluorescent whitening agent, using a light emitting module according to embodiments of the invention, is dependent on the intensity ratio of the "deep" blue light (e.g. 380-430 nm) to the total spectrum emitted by the module.

The present inventors have now also found that the intensity ratio of deep blue light to regular blue light may affect the perception of the output light as warm or cool, as well as the perception of black/white contrast.

The color temperature of the emitted light contributes to the perception of the light as natural or unnatural, especially when dimming the light source, as explained above.

Furthermore, to achieve a desired change of the perceived "crispness" of the light when dimming a "crisp white" light source, the deep blue contribution should be changed as a function of the correlated color temperature.

By increasing the ratio A', the perception of black/white contrast, especially on a FWA treated white surface, such as paper, can be enhanced, independently of the brightness of the light source. Hence, the contrast of print on a white surface, e.g. text, figures or drawings on a paper, can be increased by illuminating the surface using a light emitting module according to embodiments of the invention. The possibility of controlling of the ratio A' allows a user such as a reader to adjust the light according to his or her preference to achieve a desired contrast, independently of the light source brightness. Such personalization may be especially desirable for elderly persons or persons with visual impairment.

The control of the ratio A' of a light emitting module according to embodiments of the invention may thus be exerted based on user preferences. Personalized contrast adjustment is merely one example. Another example is control of the color temperature by controlling ratio A' for aesthetic, cosmetic or artistic purposes, where a higher A' increases the whiteness of objects, materials or even skin tones. The possibility of personalized control of the white rendition may be an attractive feature in many specialized illumination applications.

Alternatively or additionally to user control of the emission spectrum, the ratio A' of light emitted by a light emitting module according to embodiments of the invention may be adjusted according to a predetermined schedule over time, or may be adjusted in response to external conditions, such as ambient light conditions or the reflectance of an illuminated surface.

A further possibility is to modulate the ratio A' spatially in order to allow dynamic light patterning where some portions of an illuminated surface are illuminated with light of a higher or lower A' than other portions. Such patterning may be exerted by using at least two groups of second (deep blue) light emitting elements which illuminate different portions of an illuminated object, and which are controllable independently of each other, in addition to their being controllable independently of a group of first (regular blue) light emitting elements.

In embodiments of the invention the light emitting arrangement or module may comprise at least one third light emitting element adapted to emit light of a luminous intensity I3 and having an emission peak in a third wavelength range, in particular the wavelength range of from 590 to 620 nm (amber light). The third light emitting element may be a direct emitting element, e.g. and LED chip, without a wavelength converting material. Alternatively, the third light emitting element may be a phosphor-converted LED chip providing amber light emission. In either case, the addition of such an amber component may prevent even the most subtle changed in color point of the total emission spectrum of the light emitting arrangement or module when the ratio A' is increased.

The light emitting arrangement described herein may form part of a light emitting module for use in various lighting applications. For example, such a light emitting module may be used in a white light source, for example a spotlight or a luminaire, for illuminating objects e.g. in retail, exposition or home environments. In particular, the light emitting module according to embodiments of the invention, typically comprised in a spotlight, may advantageously be used for accent lighting.

The person skilled in the art realizes that the present invention by no means is limited to the preferred embodiments described above. On the contrary, many modifications and variations are possible within the scope of the appended claims. For example, one or both of the first and second light emitting elements described herein may be replaced by a suitable combination of light emitting elements and wavelength converting material, e.g. a UV LED chip and a blue phosphor.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A light emitting arrangement adapted to produce white output light and having an emission peak in the wavelength range of from 380 to 440 nm, comprising:
    at least one first light emitting element adapted to emit light of a first luminous intensity I1 and having an emission peak in a first wavelength range of from 440 to 460 nm; and
    at least one second light emitting element adapted to emit light of a second luminous intensity I2 and having an emission peak in a second wavelength range of from 380 to 440 nm,
    wherein said at least one first light emitting element and said at least one second light emitting element are independently controllable such that the second intensity of light emitted by said at least one second light emitting element can be adjusted independently of the first intensity of light emitted by the at least one first light emitting element,
    wherein a ratio A' is defined as $$A' = \frac{\int_{380}^{430} E(\lambda)(430-\lambda)d\lambda}{\int_{380}^{780} E(\lambda)d\lambda},$$

wherein A' is at least 0.6,
    light emitting arrangement further comprising:
    a controller operatively connected to said at least one first light emitting element and said at least one second light emitting element, said controller being capable of generating a first control signal to increase or decrease the first intensity I1 of the light emitted by said at least one first light emitting element, and a second control signal to increase or decrease, independently of said first control signal, the second intensity I2 of the light emitted by said at least one second light emitting element, such that the intensity ratio A' is variable by means of said controller,
    wherein said controller is adapted to decrease the second intensity I2 relative to the first intensity I1, while the light emitting module is dimmed.

2. A light emitting arrangement according to claim 1, further comprising:
    at least one wavelength converting member arranged to receive light emitted by said first light emitting element, and being capable of emitting light having an emission peak in the green to red wavelength range.

3. A light emitting arrangement according to claim 1, wherein the operation of the first and/or second light emitting elements and hence the intensity ratio A' can be controlled by a user.

4. A light emitting arrangement according to claim 2, wherein the at least one wavelength converting member (104) is arranged to receive light emitted by said first light emitting element and comprises a yellow-green phosphor material and a red phosphor material.

5. A light emitting arrangement according to claim 2, comprising a further wavelength converting member arranged to receive light emitted by said second light emitting element, wherein said further wavelength converting member comprises a yellow-green phosphor material and lacks a red phosphor material.

6. The light emitting arrangement according to claim 1, wherein the at least one second light emitting element is adapted to emit light of a second luminous intensity I2 and having an emission peak in a second wavelength range of from 380 to 430 nm.

7. A spotlight or a luminaire comprising a light emitting arrangement according to claim 1.

8. Use of a light emitting arrangement according to claim 1 for illuminating a fluorescent whitening agent.

9. A method of operating a light emitting arrangement according to claim 1, comprising the step of increasing or decreasing the intensity I2 relative to the intensity I1 and/or a total luminous intensity $I_{tot}$ of the output light produced by the light emitting arrangement, in particular increasing or decreasing the intensity ratio A'.

10. A method of operating a light emitting arrangement according to claim 9, comprising a step of increasing the intensity ratio A' by increasing the first intensity relative to the second intensity.

11. A method of operating a light emitting arrangement according to claim 9, comprising:
    decreasing the total light intensity emitted by the light emitting arrangement, and decreasing the intensity I2 relative to the intensity I1 and/or the total intensity $I_{tot}$, in particular decreasing the intensity ratio A', or
    increasing the total light intensity emitted by the light emitting arrangement, and increasing the intensity I2 relative to the intensity I1 and/or the total intensity $I_{tot}$, in particular increasing the intensity ratio A'.

12. The light emitting arrangement according to claim 1, wherein said controller is adapted to adjust A' with time.

13. The light emitting arrangement according to claim 1, wherein the color point of the white output light is tuned to lie below the black body line for correlated color temperatures of 4000 K or less.

14. The light emitting arrangement according to claim 1, comprising at least one third light emitting element adapted to emit light of a luminous intensity I3 and having an emission peak in a third wavelength range of from 590 to 620 nm.

15. The light emitting arrangement according to claim 1, wherein the peak wavelengths of the first emission peak and the second emission peak differ with at least 10 nm.

* * * * *